United States Patent [19]
Singh et al.

[11] Patent Number: 5,999,034
[45] Date of Patent: Dec. 7, 1999

[54] PULL-DOWN DRIVER CIRCUIT FOR 3.3V I/O BUFFER USING 1.9V FABRICATION PROCESS

[75] Inventors: Gajendra P. Singh, Sunnyvale; Vidyasager Ganesan, Santa Clara, both of Calif.

[73] Assignee: Sun Microsystems, Inc., Palo Alto, Calif.

[21] Appl. No.: 09/014,530

[22] Filed: Jan. 28, 1998

[51] Int. Cl.⁶ .................................................. H03K 17/16
[52] U.S. Cl. ......................... 327/391; 327/389; 327/437
[58] Field of Search .................................... 327/389, 391, 327/434, 436, 437

[56] References Cited

U.S. PATENT DOCUMENTS

| | | | |
|---|---|---|---|
| 3,950,690 | 4/1976 | Campbell | 363/126 |
| 4,791,326 | 12/1988 | Vajdic et al. | 327/391 |
| 5,028,811 | 7/1991 | Le Roux et al. | 327/110 |
| 5,568,082 | 10/1996 | Hedberg | 327/437 |
| 5,736,888 | 4/1998 | Sharpe-Geisler | 327/382 |
| 5,825,229 | 10/1998 | Manaresi et al. | 327/333 |

OTHER PUBLICATIONS

"Dynamic Dielectric Protection For I/O Circuits Fabricated in 2.5V CMOS Technology Interfacing to a 3.3V LVTTL Bus", John Connor et al., 1997 Symposium on VLSI Circuits Digest of Technical Papers.

Primary Examiner—Terry D. Cunningham
Attorney, Agent, or Firm—Townsend and Townsend and Crew LLP

[57] ABSTRACT

A circuit for controlling a voltage provided to a switching transistor in a voltage conversion buffer which drives a high voltage output with low voltage transistors. The circuit has two elements to it. First, a pull-up circuit pulls the gate of the switching transistor to a high voltage level in response to a first state of a control logic signal. Second, a pull-down circuit pulls the gate of the switching transistor down to an intermediate voltage in response to a second state of the control logic signal. The intermediate voltage is set to be less than the high voltage by no more than approximately the low voltage amount. The pull-down circuit is a transistor connected to a low voltage source, which limits the pull-down voltage. Additional transistors are provided to turn on and off the pull-down transistor, with a circuit connected to a fail-safe low voltage source being used to protect these transistors.

5 Claims, 2 Drawing Sheets

PULL-DOWN DRIVER CIRCUIT FOR 3.3V I/O BUFFER USING 1.9V FABRICATION PROCESS

BACKGROUND OF THE INVENTION

The present invention relates to output buffers for translating from circuitry operating at one voltage level to another voltage level, and in particular from 1.9V to 3.3V.

Transistor circuitry for logic chips will typically operate between a supply voltage and ground. One common supply voltage in the past has been 5V. More recently, circuit devices operating with a 3.3V supply have been developed, with other circuits being designed for 2.5V supplies and 1.9V supplies. Future circuits may use even lower voltage supplies.

The need for lower voltage supplies results from a number of factors. A lower voltage typically means that less power is consumed by the circuit, which is especially important in battery-operated devices. In addition, a lower voltage typically means a shorter transition time for signals, and thus faster clock speeds since the signal only needs to rise up to a lower voltage level.

A number of obvious difficulties arise in designing circuits to operate under lower voltage supplies. In particular, transistors require a certain amount of voltage to exceed their threshold and to turn on and off. As the voltage supply is lowered, the susceptibility to noise increases, since the same noise signal is a larger percentage of the data signal.

Additionally, there is a need to interface between circuits of different voltage levels. In particular, certain devices may standardize on one voltage level, while other devices may standardize on another voltage level, and they need to talk to each other. For example, a 3.3V bus has been adopted for certain computer systems. This is often adequate for the bus and certain peripheral logic chips or memory attached to the bus. However, in microprocessors, there may be a desire for lower voltage levels. In order to increase the speed in a microprocessor and reduce its power consumption while more gates are placed on it, a lower voltage supply is needed.

Buffer circuits have been designed to interface between circuitry of two different voltage levels. In interfacing between 1.9V and 3.3V, for instance, a particular difficulty arises when the transistors in 1.9V fabrication process can withstand only a voltage of 1.9V. Greater voltage levels could damage the transistors. Accordingly, the problem of driving a 3.3V output with circuitry that cannot put more than 1.9V across a transistor poses unique challenges. One approach for doing this is a cascode transistor arrangement in which the 3.3V is essentially applied across two transistors in series, with one being attached to a voltage reference to prevent too much voltage being applied to the other switching transistor. Typically, these two transistors should be connected between 3.3V and the output pad, and another two transistors connected between the output pad and ground or the low voltage reference.

SUMMARY OF THE INVENTION

The present invention provides a circuit for controlling a voltage provided to a switching transistor in a voltage conversion buffer which drives a higher voltage level output with lower voltage level transistors. The switching transistors and all the transistors in the circuit are limited by having the low voltage as a maximum voltage which can be applied across them. The circuit has two elements to it. First, a pull-up circuit pulls the gate of the switching transistor to a high voltage level in response to a first state of a control logic signal. Second, a pull-down circuit pulls the gate of the switching transistor down to an intermediate voltage in response to a second state of the control logic signal. The intermediate voltage is set to be less than the high voltage by no more than approximately the low voltage amount.

The pull-down circuit is a transistor connected to a low voltage source, which limits the pull-down voltage. Additional transistors are provided to turn on and off the pull-down transistor, with a circuit connected to a fail-safe low voltage source being used to protect these transistors.

In one embodiment, the pull-down transistor is an NMOS transistor, with its gate connected to a first PMOS current mirror circuit for turning it on, and a second NMOS pull-down transistor for turning it off. A second PMOS current mirror circuit turns on the second NMOS transistor, and a small leakage transistor connected to the gate of the second NMOS transistor turns it off. The second NMOS transistor is connected to a fail-safe low voltage source derived from a high voltage supply.

For a further understanding of the nature and advantages of the invention, reference should be made to the following description taken in conjunction with the accompanying drawings.

DETAILED DESCRIPTION OF THE PREFERRED EMBODIMENTS

Figure 1:
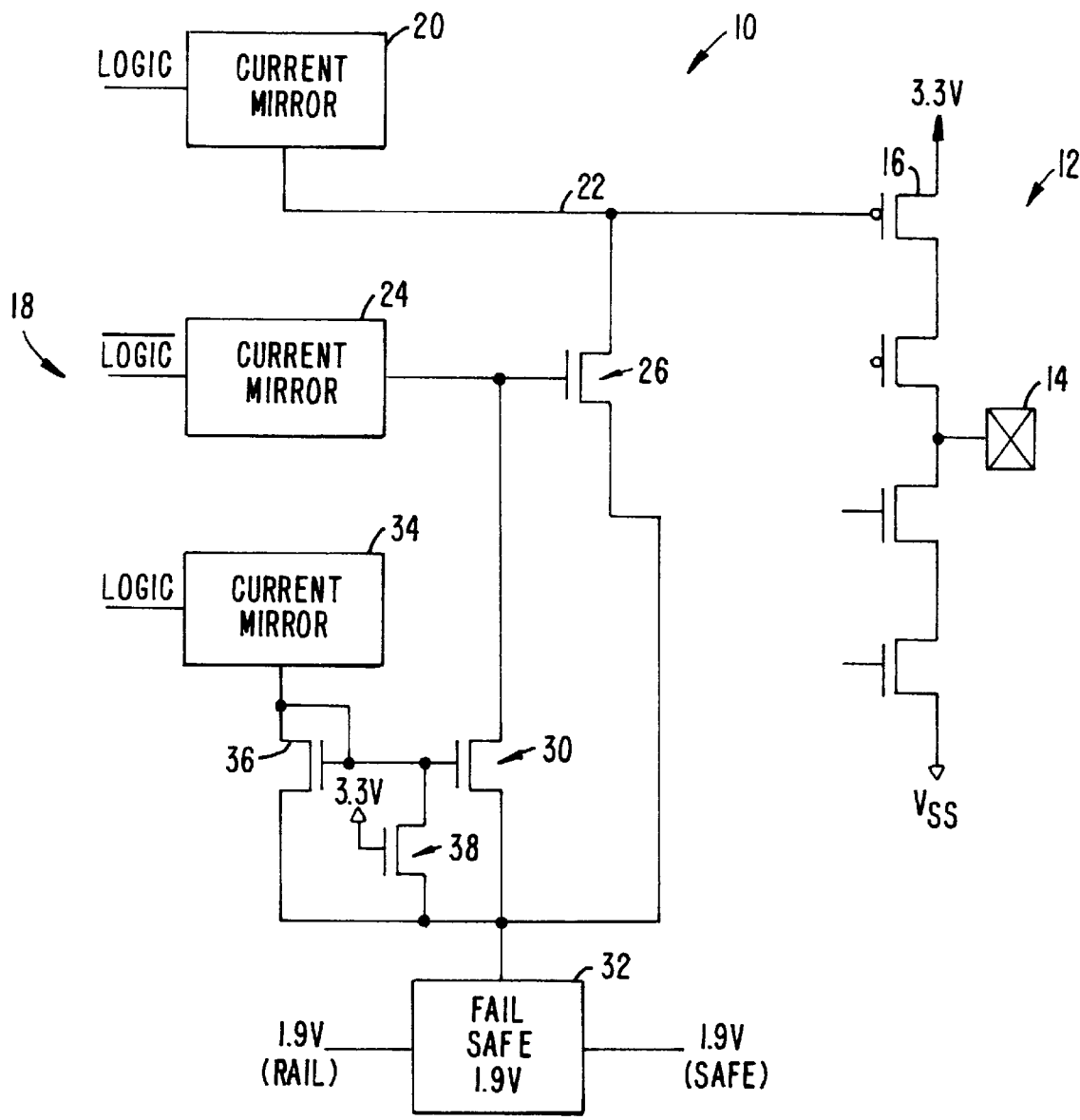
FIG. 1 is a high level diagram of the driver circuit according to one embodiment of the present invention.

FIG. 1 shows one embodiment of an output buffer according to the present invention. A cascode arrangement of transistors 12 is connected to an output pad 14, such as for connecting to a 3.3V bus. Attached to the logic high (3.3V in this case) switching transistor 16 is the driver circuit of the present invention, consisting of a pull-down circuit 18 and a pull-up circuit 20.

Pull-up circuit 20 consists of a current mirror arrangement which will pull up the voltage on line 22 in response to a logic signal. In response to the opposite logic signal, current mirror 20 will be turned off, and pull-down circuit 18 will be activated. The inverse logic signal is provided to a current mirror 24, which is connected to the gate of an NMOS pull-down transistor 26, to turn on transistor 26. The source of pull-down transistor 26 is connected to a 1.9V (rail) voltage source through a fail-safe 1.9V circuit 32.

When current mirror circuit 24 shuts off, current mirror 34 will switch on, turning on transistor 30 to switch off transistor 26. Current mirror arrangement 34 is controlled by the inverse of the logic signal turning off current circuit 24, and the same logic signal as that turning on current mirror circuit 20. Current mirror 34 operates through another NMOS transistor 36, which is connected in a common gate arrangement with transistor 30. An NMOS transistor 38 has its gate connected to 3.3V, and thus is always on, but is small enough to not draw much current when current mirror 34 is on. When current mirror 34 switches off, transistor 38 along with transistor 36 turn off transistor 30. Transistor 38 could have been applied across the gate and source of transistor 26, but it would have to be much larger and draw more current. Accordingly, by adding a second level transistor 30, transistor 38 is allowed to be made smaller.

It is desirable to protect transistor 26 from a high voltage being applied across it in the event of a failure of the 1.9V (rail) by shorting to VSS (an alternate mode of failure would be an open circuit, which would not create the same problem). Such a voltage source failure would connect the source of transistor 26 to ground, while its drain could be connected to close to 3.3V. Protection is provided through transistor to a fail-safe 1.9V circuit 32, which will connect to a safe voltage, 1.9V (safe).

1.9V (rail) is provided by a first power supply and the 3.3V source is provided from a second power supply. Since these are two separate power supplies, it is possible for the 1.9V (rail) supply to fail, while the 3.3V stays in place. A fail-safe circuit 32 includes circuitry connected to a "safe" 1.9V supply generated from the 3.3V supply, which may be an external supply in one embodiment. Because this might not have the drive needed for the pull-down transistor 26, it is only used in the event of failure of the 1.9V (rail) to protect the transistors.

Figure 2:
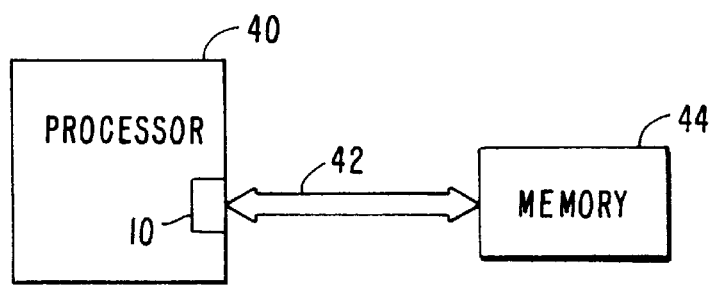
FIG. 2 is a block diagram of the circuit of FIG. 1 in a computer system.

FIG. 2 illustrates how the buffer circuitry 10 of the present invention would fit in a computer system. A microprocessor 40 is shown having buffer circuit 10 according to the present invention. Processor 40 would operate on 1.9V in this example. Buffer circuit 10 is connected to a bus 42 which is referenced to a 3.3V supply. The bus connects to a memory 44 and other components.

Figure 3:
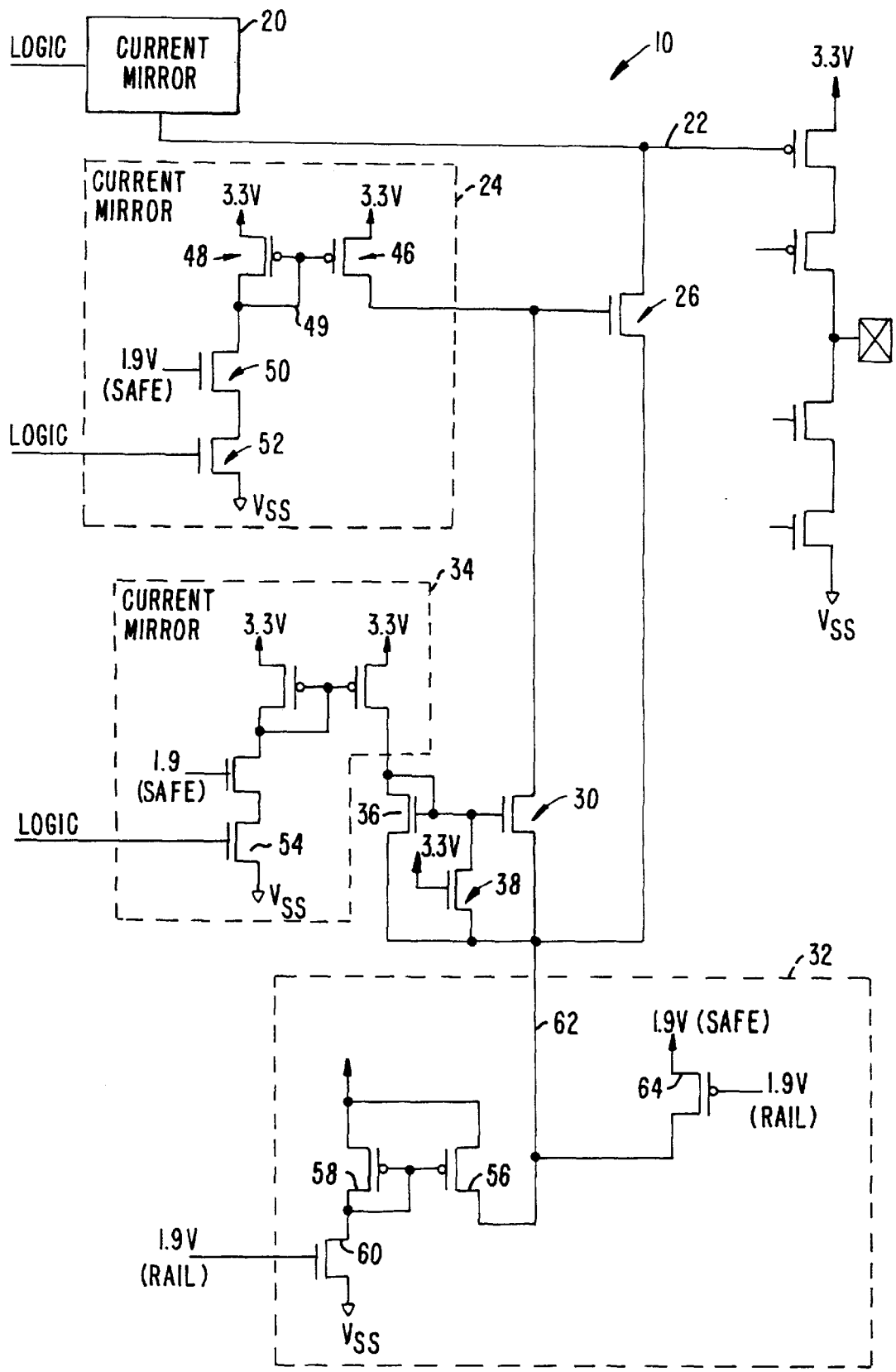
FIG. 3 is a circuit diagram of the pull-down circuit of FIG. 1.

FIG. 3 illustrates the buffer circuit of FIG. 1 in more detail. As can be seen, current mirror 24 consists of two PMOS transistors 46 and 48, and two NMOS transistors 50 and 52. Transistor 52 serves to switch on the current mirror, with transistor 50 providing protection against too much voltage being applied across transistor 52 from the 3.3V supply. This happens when transistor 52 is off, and node 49 is drawn to 3.3V. The gate of transistor 50 is connected to a 1.9V (safe) supply. As explained earlier, the indication (safe) means that this voltage is derived from the 3.3V source, and accordingly, should normally only fail in a situation where the 3.3V supply also fails.

Current mirror 34 includes a similar transistor arrangement to that of current mirror 24. However, the inverse logic signal is applied to its control transistor 54. When activated, current mirror 34 will provide current to turn on transistors 36 and 30. This will bring the gate of transistor 30 up to about 1.9V, the level of fail-safe 1.9V source 32. When current mirror 34 is turned off, transistors 36 and 38 will shut off transistor 30.

Fail-safe 1.9V source 32 has a pair of PMOS current mirror transistors 56 and 58, connected to the 1.9V (rail) supply. An NMOS transistor 60 has its gate connected to the 1.9V (rail) supply and its source to ground, Vss. Transistor 56 is connected to the source of transistors 30 and 26, at a node 62. This provides a 1.9V level to node 62 in normal conditions. Transistor 64 is off when the 1.9V (rail) is functional, so there is no DC current between the 1.9V (rail) supply and the 1.9V (safe) supply.

In the event of a failure of the 1.9V (rail) supply such that it shorts to Vss (ground), a transistor 64 ensures that node 62 will stay at 1.9V. Transistor 64 has its source connected to a 1.9V (safe) supply, provided from the 3.3V supply. Accordingly, in the event of a failure of the 1.9V (rail) source, this voltage will remain in place. The gate of PMOS transistor 64 is connected to the 1.9V (rail) supply. Thus, if this supply fails, the gate will go to zero, turning on transistor 64, and providing its 1.9V to node 62. Since the 1.9V (safe) supply has limited drive capability, it is not normally on to drive node 62, and only does so in the event of failure of the regular 1.9V (rail) supply. Upon a failure of the 1.9V (rail) supply, node 62 will no longer be driven by current mirror transistors 58 and 56, and would float with respect to these transistors. This allows transistor 64 to take over the driving of node 62.

As will be understood by those of skill in the art, the present invention may be embodied in other specific forms without departing from the spirit or essential characteristics thereof. Accordingly, the foregoing description is intended to be illustrative, but not limiting, of the scope of the invention which is set forth in the following claims.

What is claimed is:

1. A circuit for controlling a voltage provided to a switching PMOS transistor in a voltage conversion buffer, said voltage conversion buffer driving a high voltage output with low voltage transistors, said circuit comprising:
   a first NMOS pull-down transistor having a source, a gate and a drain, said drain being coupled to a gate of said switching PMOS transistor;
   an input circuit coupled to said drain of said first NMOS pull-down transistor,
   a first switchable current mirror circuit of PMOS transistors coupled to the gate of said first NMOS pull-down transistor, said first current mirror being coupled to a high voltage source;
   a second NMOS pull-down transistor having a source, a gate and a drain, said drain being coupled to said gate of said first NMOS pull-down transistor;
   a third NMOS transistor connected in a current mirror arrangement with said second NMOS transistor, having a drain and a gate, the drain being connected to the gate, the gate being connected to the gate of said second NMOS pull-down transistor, and the source being coupled to the source of said second NMOS pull-down transistor;
   a second switchable current mirror circuit of PMOS transistors coupled to the drain of said third NMOS transistor;
   a fourth NMOS transistor having a source, a drain connected to the gates of said second NMOS transistor and said third NMOS transistor, and having a gate coupled to said high voltage source; and
   a fail-safe low voltage source coupled to the sources of said first through fourth NMOS transistors and low voltage source, said fail-safe low voltage source being configured to remain on even when said low voltage source fails.

2. The circuit of claim 1 wherein said fourth NMOS transistor is less than 5 microns.

3. The circuit of claim 1 wherein said fail-safe low voltage source comprises:
   a first PMOS transistor having its drain connected to said source of said second NMOS transistor;
   a second PMOS transistor connected in a current mirror arrangement with said first PMOS transistor, said first and second transistors being connected to said low voltage source; and
   a third PMOS transistor having a drain coupled to said source of said second NMOS transistor, having a gate coupled to said low voltage source, and having a source coupled to a safe low voltage source, said safe low voltage source being derived from said high voltage source.

4. The circuit of claim 1 wherein said high voltage is approximately 3.3 volts, and said low voltage is approximately 1.9 volts.

5. A computer system comprising:

a memory;

a bus coupled to said memory;

a microprocessor coupled to said bus, said microprocessor having a circuit for driving a high voltage output with low voltage transistors, including a first NMOS pull-down transistor coupled to a gate of said switching PMOS transistor, a first current mirror circuit of PMOS transistors coupled to the gate of said first NMOS transistor, said first current mirror being coupled to a high voltage source, a second NMOS pull-down transistor coupled to said gate of said first NMOS transistor, a third NMOS transistor connected in a current mirror arrangement with said second NMOS transistor, a second current mirror circuit of PMOS transistors coupled to the drain of said third NMOS transistor, a fourth NMOS transistor having a drain connected to the gates of said second NMOS transistor and said third NMOS transistor, and having a gate coupled to said high voltage source, and a fail-safe low voltage source coupled to sources of said first through fourth NMOS transistors and a low voltage source, said fail-safe low voltage source being configured to remain on even when said low voltage source fails.

* * * * *